PULSE MODULATOR WITH TRANSISTOR SWITCH

Filed Jan. 14, 1963 2 Sheets-Sheet 1

INVENTOR.
JOE V. STOVER
BY
Robert H. Hines
ATTORNEY

May 18, 1965 J. V. STOVER 3,184,615

PULSE MODULATOR WITH TRANSISTOR SWITCH

Filed Jan. 14, 1963 2 Sheets-Sheet 2

INVENTOR.
JOE V. STOVER

BY

Robert H. Himes

ATTORNEY

United States Patent Office 3,184,615

Patented May 18, 1965

3,184,615

PULSE MODULATOR WITH TRANSISTOR SWITCH

Joe V. Stover, Anaheim, Calif., assignor to Hughes Aircraft Company, Culver City, Calif., a corporation of Delaware Filed Jan. 14, 1963, Ser. No. 251,443
8 Claims. (Cl. 307—88.5)

This invention relates to pulse modulator devices and, more particularly, to an apparatus incorporating semiconductor elements for generating pulses of continuously variable pulse width and variable pulse repetition rate.

In present day apparatus for generating pulses, the rise and fall times of the output pulses are generally limited by the rise and fall times of the basic switching transistors, and switch modules cannot be readily connected in series, parallel, or series-parallel to increase power handling capability. Further, conventional pulse generating apparatus typically requires larger drive power to initiate the switching function than that required by the apparatus of the present invention and cannot generate variable pulse width and variable repetition rate pulses over ranges comparable to that of the apparatus of the present invention without serious degradation of pulse shape unless component values are changed as a function of pulse width.

It is therefore an object of the present invention to provide an improved pulse generating apparatus.

Another object of the present invention is to provide an apparatus capable of generating pulses of determinable width without degradation of the shape thereof.

Still another object of the present invention is to provide an apparatus capable of generating pulses having a variable repetition rate over an extremely wide range of frequencies.

A further object of the present invention is to provide an improved apparatus for switching pulses which may have very large current values.

A still further object of the present invention is to provide a switching module that can be connected in series, parallel or series-parallel relationship.

An additional object of the present invention is to provide a switching module which, except for initial command signals, is capable of operating from the electrical energy to be switched.

Another object of the present invention is to provide an apparatus using transistors having current gains approaching or less than unity for switching large currents.

In accordance with one embodiment of the present invention, one or more switch modules connected in series are employed to switch current on through a load for variable intervals of time and at variable pulse repetition frequencies. The apparatus comprises generally a first transistor biased to cut-off with the collector and emitter connected from the source to the load. Further, first and second diodes are serially connected from the base of the first transistor to the load with a common polarity to allow current flow therebetween. The first diode is of a conventional type and the second diode is of a type which has the characteristic of being non-conducting until a certain critical forward voltage is reached. Last, bias is provided through a resistor connected to the base of the first transistor.

In operation, an "on trigger" pulse of a polarity which will cause current to flow through the second diode after the critical voltage is exceeded is applied to the junction between the first and second diodes. When the critical voltage is reached, the diodes conduct shorting the base to the collector of the transistor. Current then flows from the source through the transistor to the load until an "off" trigger is applied to cut off the flow of current or the polarity of the current flow reverses.

In the event current is being switched from a pulse forming network, current will reverse or go to zero thus stopping the flow of current to the load. In other cases, an additional transistor responsive to the "off trigger" is employed to shunt current away from the second diode allowing it to recover to its original non-conducting state thereby biasing the first transistor to cutoff and determining the duration of the pulse applied to the load.

For a better understanding of the invention, together with other and further objects thereof, reference is made to the following description taken in conjunction with the accompanying drawings, given by way of example, wherein.

Figure 1:
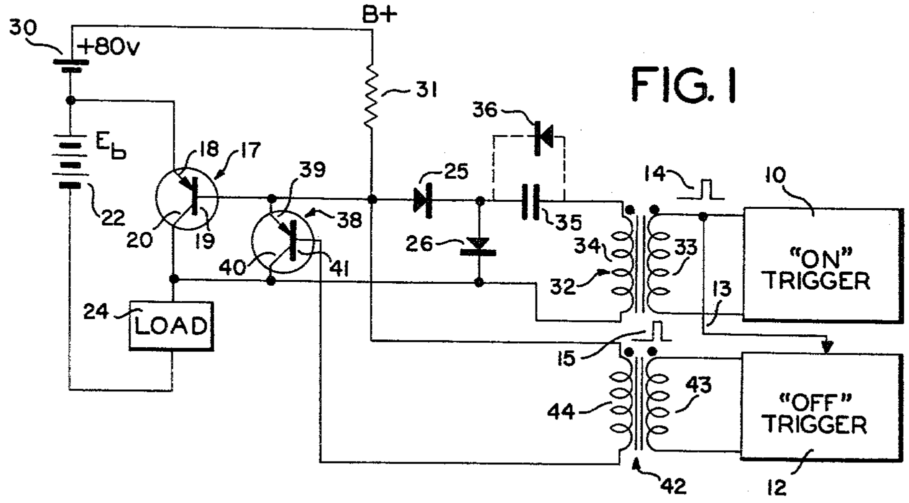
FIG. 1 shows a schematic circuit diagram of one embodiment of the invention with means to control both the commencement and termination of the pulses generated.

Referring to FIG. 1 of the drawings, there is shown an embodiment of the invention wherein an "on" trigger pulse 14 is generated by an "on" trigger generator 10 to initiate the commencement of each pulse generated by the system. The pulses thus generated by the system are terminated by an "off" trigger pulse 15 generated by an "off" trigger generator 12. "Off" trigger generator 12 for convenience is responsive to the appearance of an "on" trigger pulse 14 on a lead 13 which provides a connection from the output of "on" trigger generator 10 to an input of "off" trigger 12. Any conventional means for arbitrarily generating the "on" trigger pulses 14 and for delaying the generation of a concomitant "off" trigger pulse 15 for either fixed or variable intervals of time may be employed. In the present embodiment, the "on" trigger generator 10 generates an "on" trigger pulse 14 of 0.4 microseconds duration and having an amplitude of the order of 50 volts. The "off" trigger generator 12, on the other hand, generates an "off" trigger pulse 15 of 0.2 microsecond duration and having an amplitude of the order of 30 volts.

The basic switching of the device of the present invention is provided by a p–n–p type transistor 17 having an emitter 18, a base 19 and a collector 20. The transistor 17, for example, may be of a type designated commercially as 2N174. Numerous other transistors may be used, the type depending on the switching requirements desired. The emitter 18 of transistor 17 is connected to the positive terminal of a source 22 of direct-current potential, $E_b$, the negative terminal of which is returned through a load 24 to the collector 20 of transistor 17. In the event a type 2N174 transistor is employed for the transistor 17, the potential, $E_b$, generated by the direct-current voltage source 22 may be of the order of 80 volts.

Diodes 25, 26 are serially connected in the order named from the base 19 to the collector 20 of transistor 17 and poled to allow normal current flow from the base 19 towards the collector 20. Diode 25 is of a conventional type which may, for example, be of a type known commercially as HF9B. Diode 26, on the other hand, is of a type which conducts in the forward direction only after a certain critical voltage has been exceeded. A diode designated commercially as type 4G-100M has been found to function satisfactorily for this purpose.

Bias voltage for transistor 17 is provided by a battery 30 having a negative terminal referenced to the positive terminal of source 22 of direct-current potential and a positive terminal connected through a resistor 31 to the base 19 of transistor 17. The ohmic value of resistor 31 is determined by the voltage generated by the battery 30 and the value of current, $I_{CBO}$, i.e., the collector 20 to base 19 current with emitter 18 unconnected, for the type of transistor used for transistor 17. Battery 30 may, for example, develop of the order of 80 volts in which case resistor 31 has a resistance of the order of 4000 ohms.

The "on" trigger generator 10 is coupled to the diode 26 through a pulse transformer 32 having an input winding 33 and an output winding 34. The extremities of the input winding 33 are connected to the output of the "on" trigger generator 10, and the extremities of the output winding 34 are connected to the collector 20 of transistor 17 and through a coupling capacitor 35 to the junction between diodes 25 and 26 in a manner such that "on" trigger pulse 14 is generated by "on" trigger generator 10 is positive at the junction between diodes 25 and 26 relative to the collector 20 of transistor 17. Capacitor 35 has a capacitance of the order of 360 micromicrofarads; alternatively, a diode 36 may be used in place of the coupling capacitor 35. In this case, the diode 36 is poled to allow normal current flow from the output winding 34 of pulse transformer 32 towards the junction between diodes 25, 26. Diode 36 may be of a type designated commercially as 1N191.

When the current switched through transistor 17 does not reverse or go to zero, it is necessary to employ the "off" trigger pulse 15 developed by "off" trigger generator 12 to stop the flow of current. In this event, a transistor 38 having an emitter 39, a collector 40 and a base 41 is employed, the emitter 39 and the collector 40 being connected, respectively, to the base 19 and collector 20 of transistor 17. In addition, a pulse transformer 42 is employed having an input winding 43 connected to the output of "off" trigger generator 12 and an output winding 44 having one extremity connected to the base 41 of transistor 38 and the remaining extremity connected to the base 19 of transistor 17, which junction, as previously specified, is connected to the emitter 39 of transistor 38. In operation, output winding 44 of pulse transformer 42 allows a positive pulse to be developed from the emitter 39 to the base 41 of transistor 38.

In operation, battery 30 normally maintains the base 19 of transistor 17 positive relative to the emitter 18 thereof, thereby blocking flow of current from the source 22 of direct-current potential to the load 24. The "on" trigger pulse 14 developed by "on" trigger generator 10 is applied in a manner to initially develop a voltage in the forward direction across the diode 26. The "on" trigger pulse 14 is necessarily of an amplitude which in conjunction with the quiescent voltage maintained between base 19 and collector 20 of transistor 17 by the battery 22 exceeds the critical voltage of diode 26. Upon exceeding the critical voltage of diode 26, current immediately flows from the battery 30 through the diodes 25, 26 to the load circuit to remove the bias on base 19 of transistor 17 thereby allowing current to flow directly from the source of direct potential 22 through base 19 and collector 20 of transistor 17 into load 24. As evident from the foregoing, the rise time of the "on" trigger pulse 14 is not critical as no current flows through the load until the critical voltage of diode 26 has been reached. At this time, maximum current flows immediately through the load 24.

Figures 2, 4:
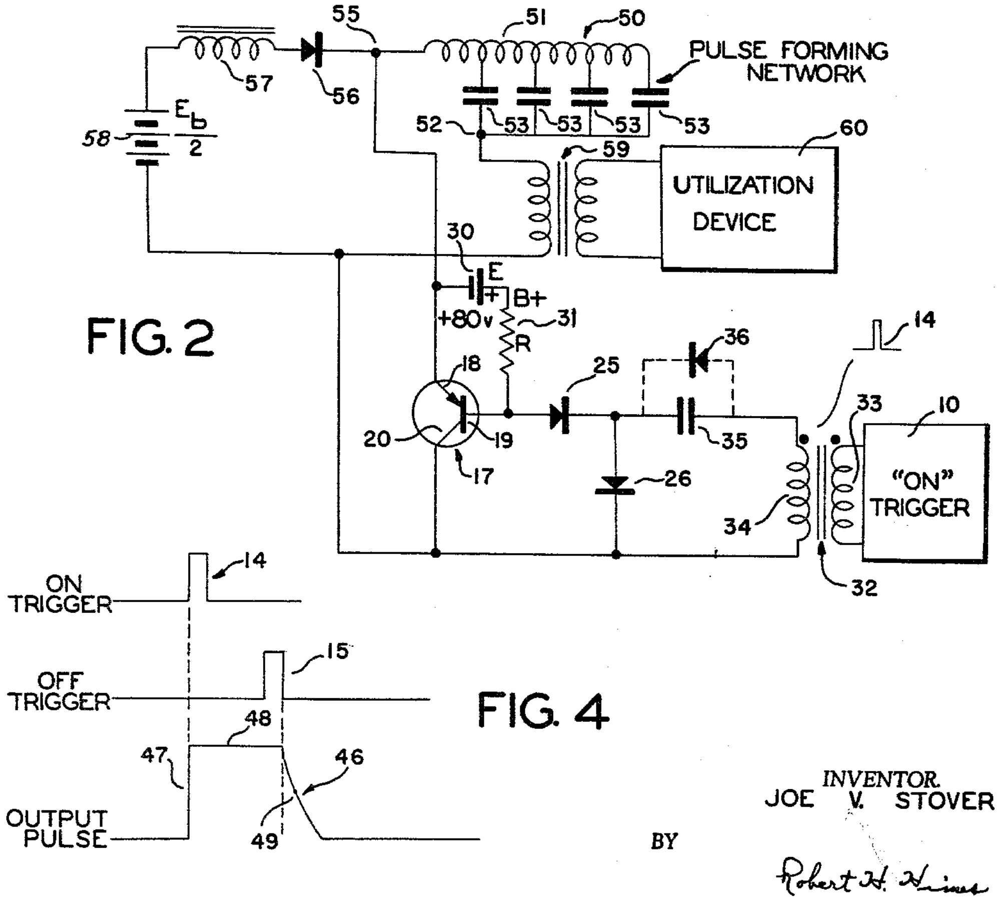
FIG. 2 illustrates a schematic circuit diagram of an embodiment of the invention employed in conjunction with a line type pulse forming network.
FIG. 4 illustrates the "on" and "off" trigger pulses of the apparatus of FIG. 1 together with the waveform of the resulting output pulses.

Waveforms illustrating the relationship between the "on" trigger pulse 14 and a current pulse 46 which is switched through the load 24 are illustrated in FIG. 4. Referring to this figure, the leading-edge 47 of the pulse 46 reaches maximum amplitude in a time determined by the inductance of load 24, which can be reduced to substantially zero, after which time a constant flow of current illustrated by portion 48 of the pulse 46 continues until stopped by the occurrence, in this case by the trailing-edge of "off" trigger pulse 15. In that there are no coupling capacitors or capacitors to discharge, the current pulse 46 may be allowed to continue as long as desirable without decrease in the amplitude thereof. Occurrence of the positive "off" trigger pulse generated at the base 41 of transistor 38 initiates the flow of current through the transistor 38 diverting current away from diode 26 and allowing diode 26 to assume its normal non-conducting state. Upon termination of the positive "off" trigger pulse applied at base 41 of transistor 38 current flow from base 19 of transistor 17 is interrupted. This termination of current to base 19 of transistor 17 cuts off the flow of current in collector 20 of transistor 17 and interrupts all current flow to load 24. The trailing-edge portion 49 of the pulse 46 does not decrease to zero immediately due to storage effects occurring in transistor 17.

Referring now to FIG. 2 of the drawings wherein like reference numerals refer to like components, there is shown the apparatus of the present invention as employed in conjunction with a line-type pulse forming network whereby no "off" trigger pulse 15 is required. In particular, the transistor 17, resistor 31, diodes 25, 26, coupling capacitor 35, pulse initiating transformer 32 and "on" trigger generator 10 are connected together in the same manner as in the device of FIG. 1. The pulse forming system, on the other hand, includes a pulse forming network 50 including an inductive winding 51 with four capacitors 53 periodically connected from three intermediate symmetric taps on inductive winding 51 and one extremity thereof to a common junction 52. The remaining extremity of inductive winding 51 of pulse forming network 50 is connected to a junction 55, which junction 55 is, in turn, connected through a diode 56 and a charging choke 57 to the positive terminal of a battery 58, the negative terminal of which is returned through the primary winding of a pulse load transformer 59 to the common junction 52 of the pulse forming network 50. The diode 56 is poled to allow normal current flow towards the junction 55 and the battery 58 generates a voltage of the order of $E_b/2$, i.e., one-half that of direct-current source 22 in the device of FIG. 1. Lastly, emitter 18 of transistor 17 together with the negative terminal of battery 30 are connected to the junction 55 and the collector 20 of the transistor 17 is connected to the negative terminal of the battery 58, whereby the total voltage, to which the pulse forming network 50 is charged, is applied across the transistor 17. The output of the system is developed across the secondary winding of the pulse load transformer 59, which winding is connected to a utilization device 60. Utilization device 60 may, for example, constitute a magnetron, klystron or other similar device.

In operation, the battery 58 causes a current to flow through the charging choke 57 which develops sufficient inertia as to charge the pulse forming network 50 to a voltage, $E_b$. The diode 56 prevents the pulse forming network 50 from discharging after being charged to the voltage, $E_b$. Thus, the potential available at junction 55 is substantially the same as that of source 22 of direct-current potential in the device of FIG. 1. Under non-conducting conditions, the battery 30 maintains the base 19 positive relative to the potential of emitter 18 thus preventing flow of current through the transistor 17. Current flow through transistor 17 commences upon the appearance of "on" trigger pulse 14 in the same manner as described in connection with FIG. 1. In the device of FIG. 2, however, current flow through transistor 17 stops when the direction of current flow therethrough would reverse or reduce to zero due to the flow of current out of the pulse forming network 50. Thus, the width of the pulse generated across the secondary winding of the output pulse transformer 59 is determined in the conventional manner by the characteristics of the pulse forming network 50.

Figure 3:
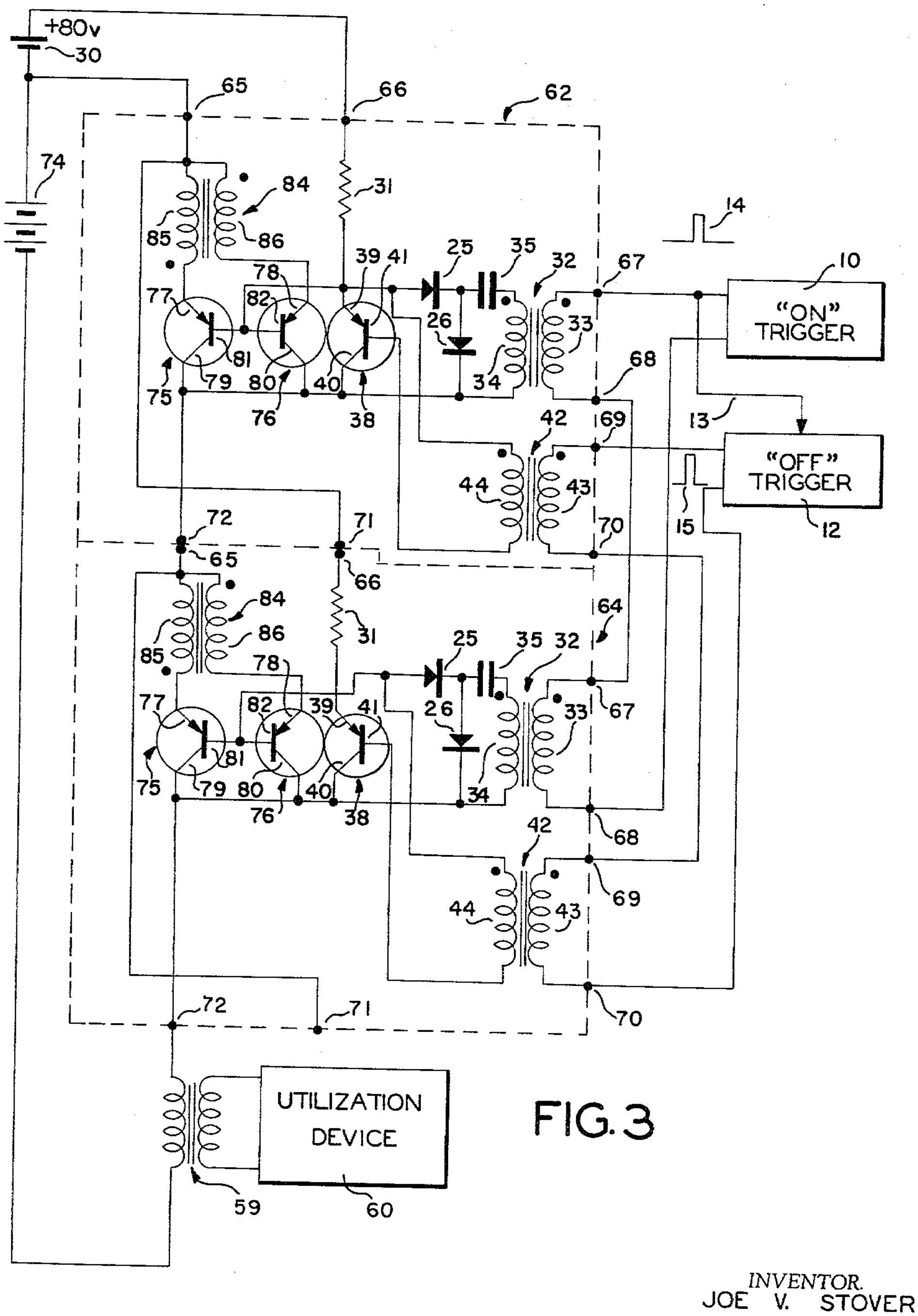
FIG. 3 shows an embodiment of the invention employing switching modules connected in series with each module having two switching transistors operating in parallel.

Referring now to FIG. 3, there is shown an embodiment of the invention including substantially identical modules 62, 64 connected in series. Each of the modules 62, 64 have a switching current input terminal 65, a bias current input 66, "on" trigger input terminals 67, 68, "off" trigger input terminals 69, 70, a bias current output terminal 71, and a switching output terminal 72. "On" trigger input terminals 67, 68 of modules 62, 64 are connected in either series or parallel to the output of the "on" trigger generator 10 so that the "on" trigger pulse 14 is applied to the primary winding 33 of the pulse transformer 32 at exactly the same time. Similarly, the "off" trigger input terminals 69, 70 of modules 62, 64 are connected in either series or parallel to the output of "off" trigger generator 12 in order that the "off" trigger pulse 15 is applied to the primary windings 43 of the pulse transformers 42 of the modules 62, 64 at the same time. "On" trigger generator 10 and "off" trigger generator 12 operate in the same manner as in the device described in connection with FIG. 1.

With regard to the intermediate connections between the modules 62, 64, and any additional modules if employed, the switching-current output terminal 72 of module 62 is connected to the switching-current input terminal 65 of module 64 and the bias-current output terminal 71 of module 62 is connected to the bias-current input terminal 66 of module 64. In addition, the positive terminal of a source 74 of direct-current potential is connected to the switching-current input terminal 65 of module 62 and the negative terminal thereof connected through the primary winding of output pulse transformer 59 to the switching-current output terminal 72 of module 64. In the case of the apparatus of FIG. 3, the source 74 of direct-current potential will generally provide a voltage which will determine the number of modules 62, 64 that are necessary to employ. As before, the negative terminal of battery 30 is referenced to the positive output of the source 74, and the positive terminal thereof is connected to the bias-current input terminal 66 of module 62. The remaining unconnected bias-current output terminal 71 of module 64, i.e., the last module in the chain, is left unconnected.

Concerning the internal connections of the modules 62, 64, the transistor 38, diodes 25, 26, capacitor 35 and pulse transformers 32, 42 are connected in the same manner as in the apparatus of FIG. 1. The switching-current input terminal 65 is connected direct to the bias-current output terminal 71. The bias-current input terminal 66 is, in turn, connected through the resistor 31 to the emitter 39 of transistor 38. In addition, each module 62 or 64 includes p-n-p type switching transistors 75, 76 having emitters 77, 78, collectors 79, 80 and bases 81, 82, respectively. The bases 81, 82 of the transistors 75, 76 are connected together and are, in turn, connected to the emitter 39 of transistor 38. Similarly, the collectors 79, 80 are both connected to the collector 40 of transistor 38 and, in addition, are connected to the output switching terminals 72. Lastly, a transformer 84 has windings 85, 86 that are connected, respectively, from the emitters 77, 78 to the switching-current input terminal 65. The windings 85, 86 of transformer 84 have equal numbers of turns and are poled in the opposite direction relative to the switching-current input terminal 65 thereby to maintain an equal flow of current to each of the transistors 75, 76 which are connected in parallel. The operation of the switching modules 62, 64 is the same as for the apparatus described in connection with FIG. 1.

Although the invention has been shown in connection with a certain specific embodiment, it will be readily apparent to those skilled in the art that various changes in form and arrangement of parts may be made to suit requirements without departing from the spirit and scope of the invention.

What is claimed is:

1. A transistor switching apparatus for controlling current flow between a direct-current source of potential and a load, said apparatus comprising a transistor including a base and two remaining elements, said transistor being connected from said direct-current source of potential to said load with said two remaining elements; first and second unidirectional conducting elements connected in the order named from said base of said transistor to said load, said first and second unidirectional conducting elements both being poled to allow normal current flow in a direction that is the same as the direction of current flow from said direct-current source of potential to said load and said second unidirectional conductor element having a critical potential below which current does not flow therethrough; means connected to said base of said transistor for normally biasing said transistor by an amount less than said critical potential to prevent current flow therethrough; means coupled across said second unidirectional conducting element for controllably increasing the voltage thereacross by an amount required to no less than exceed said critical voltage to allow base current for said transistor to flow thereby to initiate current flow between said direct-current source of potential to said load through said transistor; and means connected from said base of said transistor to said load for controllably shunting current flow past said first and second unidirectional conducting elements for a determinable interval of time thereby to cause said second unidirectional conducting element to revert to the non-conductive state whereby current flow through said transistor ceases at the end of said determinable interval.

2. A transistor switching apparatus for controlling current flow from a direct-current source of potential to a load, said apparatus comprising a first p-n-p type transistor including a base, an emitter connected to said direct-current source of potential, and a collector connected to said load; first and second diodes connected in the order named from said base of said first transistor to said load, said first and second diodes both being poled to allow current flow in the forward direction from said base of said first transistor to said load and said second diode having a critical potential below which current does not flow therethrough; means connected to said base of said first transistor for normally biasing said first transistor to prevent current flow therethrough; means coupled across said second diode for controllably increasing the forward voltage thereacross by an amount required to no less than exceed said critical voltage to allow a base current for said first transistor to flow thereby to initiate current flow from said direct-current source of potential to said load through said first transistor; and a second p-n-p type transistor having an emitter, a collector and a base, said emitter and said collector being connected, respectively, to said base of said first transistor and to said load; and means including a transformer having a secondary winding connected from said base of said first transistor to said base of said second transistor for applying a positive potential therebetween for a determinable period of time thereby to cause said second diode to revert to the non-conductive state whereby current flow through said first transistor ceases at the end of said determinable period of time.

3. The transistor switching apparatus as defined in claim 2 wherein said means coupled across said second diode includes a pulse transformer having a primary and a secondary winding, said primary winding being responsive to a source of pulses for initiating current flow through said first transistor and said secondary winding being coupled across said second diode in a manner to apply positive pulses in the forward direction thereacross.

4. A pulse generating apparatus comprising a pulse forming network having first and second terminals; a source of direct-current potential having positive and negative terminals; an inductor and a diode serially connected from said positive terminal to said first terminal of said pulse forming network, said diode being poled to allow normal current flow towards said first terminal; means including a transformer having a primary winding connected from said negative terminal of said direct-current source of potential to said second terminal of said pulse forming network for utilizing pulses generated by said apparatus; a p-n-p type transistor having an emitter, a collector and a base, said emitter being connected to said first terminal of said pulse forming network and said collector being referenced to said negative terminal of said source of direct-current potential; first and second diodes connected in the order named from said base to said collector of said transistor, said first and second diodes both being poled to normally allow current flow in the forward direction from said base to said collector of said transistor and said second diode having a critical potential in the forward direction below which current will not flow therethrough; means referenced to said first terminal of said pulse forming network for biasing said base of said transistor positive relative to said first terminal thereby to normally prevent current flow through said transistor; and means coupled across said second diode for controllably increasing the forward voltage thereacross by an amount required to no less than exceed said critical voltage to allow base current for said transistor to flow therethrough thereby initiating current flow through said transistor whereby a charge on said pulse forming network is discharged through said primary winding of said transformer.

5. In a pulse generating apparatus, a switching module having first and second terminals adapted to be connected in series with a conductor carrying a current to be switched, a third terminal maintained at a positive potential relative to the potential of said first terminal, and fourth and fifth terminals adapted to receive a first trigger pulse for initiating current flow through said module, said module comprising: a first p-n-p type transistor having an emitter, a collector and a base, said emitter being connected to said first terminal and said collector being connected to said second terminal; first and second diodes connected in the order named from said base to said collector of said first transistor, said first and second diodes being poled to allow current flow in the forward direction therethrough from said base to said collector of said first transistor and said second diode having a critical potential below which current will not flow therethrough; a resistor connected from said third terminal to said base of said first transistor thereby to prevent current flow therethrough; a pulse transformer having primary and secondary windings, said primary winding being connected across said fourth and fifth terminals and said secondary winding being coupled directly across said second diode, said primary and secondary windings having relative polarities to apply said first trigger pulse across said second diode in the forward direction.

6. In a pulse generating apparatus, a switching module as defined in claim 5 additionally including sixth and seventh terminals adapted to receive a second trigger pulse for terminating current flow through said module; a second p-n-p type transistor having an emitter, a collector and a base, said emitter and said collector of said second transistor being connected, respectively, to said base and said collector of said first transistor; and a pulse transformer having primary and secondary windings, said primary winding being connected between said sixth and seventh terminals and said secondary winding being connected from said base of said first transistor to said base of said second transistor, the polarity of said secondary winding being oriented to make said second trigger pulse positive at said base of said first transistor relative to the potential at the base of said second transistor.

7. In a pulse generating apparatus, a switching module having first and second terminals adapted to be connected in series with a conductor carrying a current to be switched; a third terminal maintained at a positive potential relative to the potential of said first terminal; fourth and fifth terminals adapted to receive a first trigger pulse for initiating current flow through said module, said module comprising: first and second p-n-p type transistors each having an emitter, a collector and a base, said collectors both being connected to said second terminal; a transformer having first and second windings of equal numbers of turns, said first winding being connected from said emitter of said first transistor to said first terminal and said second winding being connected from said emitter of said second transistor to said first terminal, said first and second windings being poled in opposite directions relative to said first terminal thereby to maintain substantially equal current flow through said first and second p-n-p type transistors; first and second diodes connected in the order named from both the bases of said first and second transistors to said second terminal, said first and second diodes being poled to allow current flow in the forward direction therethrough from said bases to said second terminal and said second diode having a critical potential below which current will not flow therethrough; a resistor connected from said third terminal to said bases of said first and second transistors thereby to prevent current flow therethrough; a pulse transformer having primary and secondary windings, said primary winding being connected across said fourth and fifth terminals and said secondary winding being coupled directly across said second diode, said primary and secondary windings having relative polarities to apply said first trigger pulse across said second diode in the forward direction.

8. In a pulse generating apparatus, a switching module as defined in claim 7 additionally including sixth and seventh terminals adapted to receive a second trigger pulse for terminating current flow through said module; a third p-n-p type transistor having an emitter, a collector and a base, said emitter and said collector of said third transistor being connected, respectively, to said bases and said collectors of said first and second transistors; and a pulse transformer having primary and secondary windings, said primary winding being connected between said sixth and said seventh terminals and said secondary winding being connected from said bases of said first and second transistors to said base of said third transistor.

References Cited by the Examiner

UNITED STATES PATENTS 3,122,651 2/64 Hawkins et al. -------- 307—88.5

FOREIGN PATENTS 625,710 8/61 Canada.

ARTHUR GAUSS, *Primary Examiner.*